United States Patent
Gao et al.

(10) Patent No.: US 11,936,390 B2
(45) Date of Patent: Mar. 19, 2024

(54) LOW-POWER FRACTIONAL-N PHASE-LOCKED LOOP CIRCUIT

(71) Applicant: ZHEJIANG UNIVERSITY, Zhejiang (CN)

(72) Inventors: Xiang Gao, Hangzhou (CN); Gaofeng Jin, Hangzhou (CN); Fei Feng, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 17/973,518

(22) Filed: Oct. 25, 2022

(65) Prior Publication Data

US 2023/0053266 A1    Feb. 16, 2023

Related U.S. Application Data

(63) Continuation of application No. PCT/CN2022/072209, filed on Jan. 17, 2022.

(30) Foreign Application Priority Data

Jan. 27, 2021    (CN) .......................... 202110110734.5

(51) Int. Cl.
   *H03L 7/091*    (2006.01)
   *H03L 7/099*    (2006.01)
   *H03L 7/10*    (2006.01)

(52) U.S. Cl.
   CPC ............ *H03L 7/091* (2013.01); *H03L 7/0995* (2013.01); *H03L 7/103* (2013.01)

(58) Field of Classification Search
   CPC ......... H03L 7/091; H03L 7/087; H03L 7/093; H03L 7/097; H03L 7/0995; H03L 7/103; H03L 7/18; H03L 7/20
   See application file for complete search history.

(56) References Cited

U.S. PATENT DOCUMENTS

| | | | | |
|---|---|---|---|---|
| 5,614,869 A | * | 3/1997 | Bland | ..................... H03K 23/66 331/25 |
| 5,703,537 A | * | 12/1997 | Bland | ..................... H03L 7/183 331/25 |

(Continued)

FOREIGN PATENT DOCUMENTS

| | | |
|---|---|---|
| CN | 104506190 A | 4/2015 |
| CN | 105871372 A | 8/2016 |

(Continued)

OTHER PUBLICATIONS

International Search Report (PCT/CN2022/072209); dated Mar. 30, 2022.

(Continued)

*Primary Examiner* — James M Perez
(74) *Attorney, Agent, or Firm* — W&G Law Group (57) ABSTRACT

Disclosed is a low-power fractional-N phase-locked loop circuit, which comprises a phase detector, a voltage-to-current converter, a loop filter, a voltage-controlled oscillator, a frequency divider and a digital logic processor; the phase detector, the voltage-to-current converter, the loop filter, the voltage-controlled oscillator and the frequency divider are connected in sequence; a reference signal is input from the phase detector, the phase detector detects the phases of the reference signal and a feedback signal with a quantization error output by the frequency divider, compensates a quantization phase error generated by fractional frequency division, and outputs a compensated phase detection result to the voltage-to-current converter; the quantization error generated by fractional frequency division is converted into a voltage domain through a digital domain or directly coupled to a phase error signal in the phase detector to complete the compensation of the quantization error.

4 Claims, 6 Drawing Sheets

(56) References Cited

U.S. PATENT DOCUMENTS

| | | | | |
|---|---|---|---|---|
| 5,945,855 A * | 8/1999 | Momtaz | H03L 7/0896 | 375/373 |
| 6,900,675 B2 * | 5/2005 | Briones | H03L 7/087 | 327/147 |
| 6,995,618 B1 * | 2/2006 | Boecker | H03L 7/099 | 331/34 |
| 7,737,743 B1 * | 6/2010 | Gao | H03L 7/113 | 327/158 |
| 7,825,737 B1 * | 11/2010 | Fang | H03L 7/081 | 331/25 |
| 8,564,471 B1 * | 10/2013 | Gao | G04F 10/005 | 341/166 |
| 9,356,612 B2 * | 5/2016 | Gao | H03L 7/0992 | |
| 9,362,936 B1 * | 6/2016 | Caffee | H03K 5/135 | |
| 9,740,175 B2 * | 8/2017 | Burg | G04F 10/005 | |
| 9,853,650 B1 * | 12/2017 | Kuan | H03L 7/0814 | |
| 9,966,937 B2 * | 5/2018 | Yayla | H03K 5/00006 | |
| 10,103,741 B2 * | 10/2018 | Gao | H03L 7/0992 | |
| 10,122,378 B2 * | 11/2018 | Kim | H03M 1/68 | |
| 10,218,341 B2 * | 2/2019 | Tee | H03L 7/1974 | |
| 10,313,105 B2 * | 6/2019 | Gao | H04L 7/0025 | |
| 10,601,431 B2 * | 3/2020 | Caffee | G04F 10/005 | |
| 10,693,482 B2 * | 6/2020 | Caffee | G04F 10/005 | |
| 10,804,913 B1 * | 10/2020 | Talegaonkar | H03L 7/0807 | |
| 10,895,850 B1 * | 1/2021 | Elkholy | G04F 10/005 | |
| 10,911,037 B2 * | 2/2021 | Tee | H03L 7/1976 | |
| 10,965,297 B1 * | 3/2021 | Wu | H03L 7/0805 | |
| 11,018,688 B1 * | 5/2021 | Guo | H03L 7/193 | |
| 11,095,296 B2 * | 8/2021 | Hermoso | H03B 5/1265 | |
| 11,231,268 B2 * | 1/2022 | Chen | G01B 9/02008 | |
| 11,418,205 B1 * | 8/2022 | Schwarz | H03L 7/0992 | |
| 11,482,932 B2 * | 10/2022 | Volk | H02M 3/157 | |
| 11,626,883 B2 * | 4/2023 | Wu | H03M 1/0607 | 341/144 |
| 2002/0017939 A1 * | 2/2002 | Okuda | G11C 7/1051 | 327/296 |
| 2002/0136342 A1 * | 9/2002 | Lee | H03L 7/0898 | 375/376 |
| 2005/0221780 A1 * | 10/2005 | Chien | H03L 7/1976 | 455/264 |
| 2005/0258901 A1 * | 11/2005 | Khorramabadi | H03F 3/45188 | 330/254 |
| 2006/0076993 A1 * | 4/2006 | Teo | H03L 7/107 | 386/263 |
| 2006/0077009 A1 * | 4/2006 | Christoffers | H03L 7/093 | 331/16 |
| 2007/0018701 A1 * | 1/2007 | Abbasi | H03L 7/1072 | 327/157 |
| 2008/0036536 A1 * | 2/2008 | Khorramabadi | H03B 5/1228 | 330/252 |
| 2008/0238489 A1 * | 10/2008 | Sanduleanu | H03L 7/0896 | 327/42 |
| 2009/0034650 A1 * | 2/2009 | Norimatsu | H04B 1/7174 | 375/295 |
| 2009/0153203 A1 * | 6/2009 | Okamoto | H03L 7/099 | 327/156 |
| 2010/0013532 A1 * | 1/2010 | Ainspan | H03L 7/107 | 327/159 |
| 2010/0327981 A1 * | 12/2010 | Yang | H03L 7/1976 | 327/536 |
| 2013/0162309 A1 * | 6/2013 | Tamura | H03L 7/06 | 327/156 |
| 2013/0271229 A1 * | 10/2013 | Gao | H03L 7/23 | 331/19 |
| 2015/0130544 A1 * | 5/2015 | Gao | H03L 7/18 | 331/18 |
| 2015/0142715 A1 * | 5/2015 | Esterline | G06N 3/02 | 706/23 |
| 2015/0171890 A1 * | 6/2015 | Pagnanelli | H03M 3/468 | 341/143 |
| 2015/0200588 A1 * | 7/2015 | Cheng | H03L 7/0895 | 327/536 |
| 2016/0254818 A1 * | 9/2016 | Luo | H03L 7/089 | 327/159 |
| 2016/0373094 A1 * | 12/2016 | Yayla | H03B 19/14 | |
| 2016/0373120 A1 * | 12/2016 | Caffee | H03L 7/183 | |
| 2017/0194972 A1 * | 7/2017 | Sai | H03L 7/06 | |
| 2017/0205772 A1 * | 7/2017 | Burg | H03L 7/18 | |
| 2017/0288686 A1 * | 10/2017 | Gao | H03L 7/081 | |
| 2017/0366376 A1 * | 12/2017 | Wang | H04L 27/2017 | |
| 2017/0373709 A1 * | 12/2017 | Kondo | H03G 3/3042 | |
| 2018/0138899 A1 * | 5/2018 | Tee | H03L 7/0992 | |
| 2018/0269895 A1 * | 9/2018 | Kim | G04F 10/005 | |
| 2019/0081772 A1 * | 3/2019 | Gao | H04L 7/0331 | |
| 2019/0088347 A1 * | 3/2019 | Tang | G11C 27/024 | |
| 2019/0214976 A1 * | 7/2019 | Wu | H03L 7/0805 | |
| 2019/0280698 A1 * | 9/2019 | Kearney | H03L 7/0814 | |
| 2019/0393867 A1 * | 12/2019 | Tee | H03L 7/1974 | |
| 2020/0373923 A1 * | 11/2020 | Walsh | H03K 17/9547 | |
| 2021/0025689 A1 * | 1/2021 | Chen | G01B 9/02008 | |
| 2021/0409029 A1 * | 12/2021 | Moslehi Bajestan | H03L 7/089 | |
| 2022/0190833 A1 * | 6/2022 | Moslehi Bajestan | H03L 7/1976 | |
| 2022/0224348 A1 * | 7/2022 | Perrott | H03L 7/087 | |
| 2022/0255553 A1 * | 8/2022 | Zhao | G04F 10/005 | |
| 2023/0053266 A1 * | 2/2023 | Gao | H03L 7/1974 | |
| 2023/0095293 A1 * | 3/2023 | Neveu | H03L 7/099 | 327/157 |
| 2023/0122691 A1 * | 4/2023 | Kim | H03L 7/099 | 327/156 |
| 2023/0318608 A1 * | 10/2023 | Uehara | H03L 7/099 | 327/291 |

FOREIGN PATENT DOCUMENTS

| | | |
|---|---|---|
| CN | 109936361 A | 6/2019 |
| CN | 110739966 A | 1/2020 |
| CN | 110908270 A | 3/2020 |
| CN | 112953516 A | 6/2021 |

OTHER PUBLICATIONS

CN First Office Action(202110110734.5); dated May 24, 2022.
A-265-μW-Fractional-N-Digital-E'll-W.itb-Seamless-81 1tomatic.
A-3.3-4.5GHZ-Fractional-N-Sampling-PLL-with-A-Merged-Constant-Slope-DTC-and-Sampling-PD-in-40nm-CMOS.
Frequency-synthesis-theory, design-and-application(machine translation).

* cited by examiner

LOW-POWER FRACTIONAL-N PHASE-LOCKED LOOP CIRCUIT

CROSS-REFERENCE TO RELATED APPLICATIONS

The present application is a continuation of International Application No. PCT/CN2022/072209, filed on Jan. 17, 2022, which claims priority to Chinese Application No. 202110110734.5, filed on Jan. 27, 2021, the contents of both of which are incorporated herein by reference in their entireties.

TECHNICAL FIELD

The present disclosure relates to the field of generation and synthesis of frequency in a radio frequency integrated circuit, in particular to a low-power fractional-N phase-locked loop circuit.

BACKGROUND

A phase-locked loop is widely used in electronic system. It can be used as a local oscillator signal in a communication system, a sampling clock in digital-to-analog converter and so on. The phase-locked loop is a negative feedback system, in which by comparing the phase errors of a reference signal and a feedback signal and controlling the voltage controlled oscillator to adjust the frequency of an output signal, the frequency of the output signal is made to be a fixed multiple of that of the reference signal, and the phase thereof is synchronized with that of the reference signal, that is, the output signal is locked to the reference signal.

In a feedback loop of the phase-locked loop, a frequency divider divides an oscillation signal with a frequency of a fixed multiple of the frequency of the reference signal and feeds it back to a phase detector. In order to realize fractional-N PLL, the frequency dividing ratio of the frequency divider will be modulated, and a sequence of integer frequency dividing ratios will be used to realize fractional frequency division dynamically. The dynamic adjustment of the frequency dividing ratio is carried out by a sigma-delta modulator, which accumulates and quantifies the fractional part to obtain the real-time frequency dividing ratio. In the process of quantization, there will be errors between the actual frequency dividing ratio and the ideal fractional frequency dividing ratio, and there will be a quantization phase error in the feedback signal, resulting in the presence of quantization noise in the frequency spectrum of the signal output by the phase-locked loop.

Figure 1:
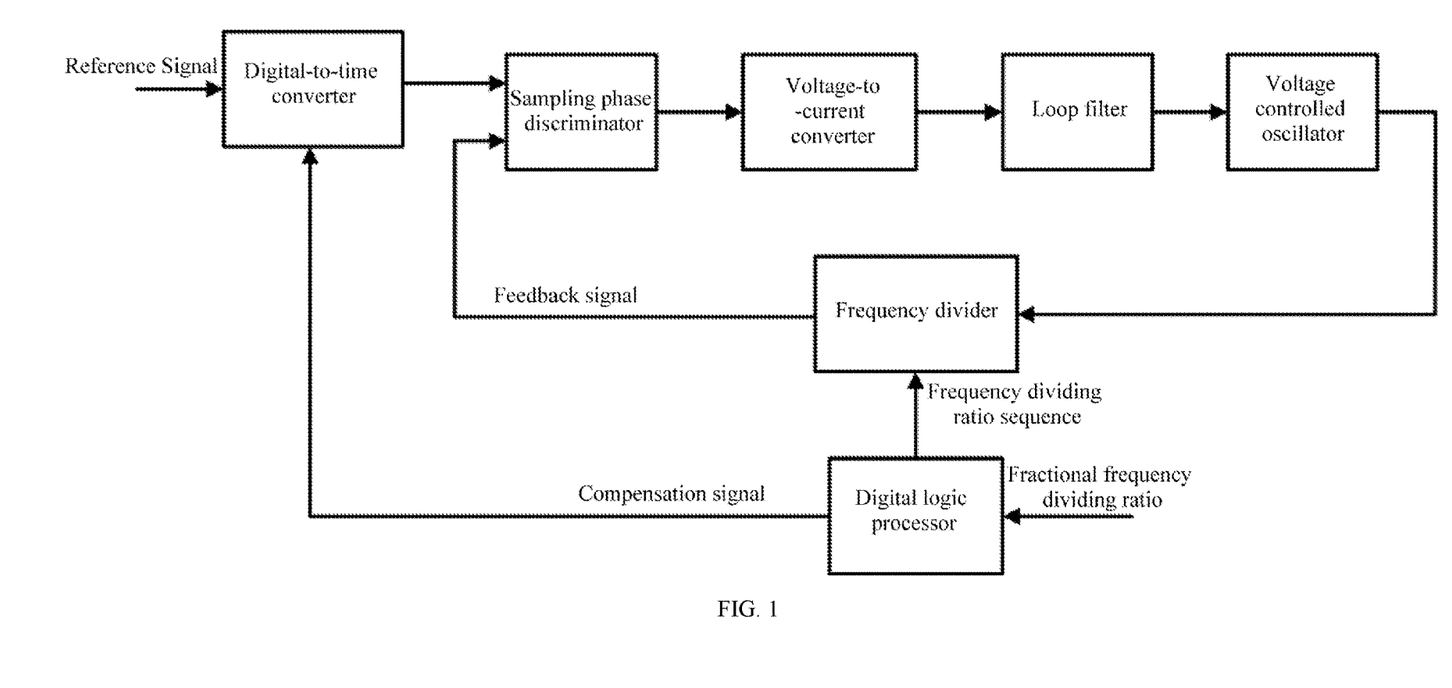
FIG. 1 is a schematic diagram of the structure of a traditional fractional-N phase-locked loop circuit.

As shown in FIG. 1, in the traditional fractional-N phase-locked loop, a digital-to-time converter is inserted into the feedback loop or reference path to compensate the quantization error caused by fractional frequency division. In the digital-to-time converter, the compensation signal generated by the digital logic processor will control the process of edge generation and compensate the quantization phase error. After compensation, the phase of the signal is compared with that of the other signal in the sampling phase detector, and it is converted into a control signal in a digital domain or a voltage domain. In the process of compensation, the digital-to-time converter will generate an edge with an easy slope according to the quantization noise, and then the slope will be converted into a steep edge. In the sampling phase detector, the steep edge will generate an easy slope again. In the process of compensation and phase detection, there are many conversion operations between edge and slope, which will increase power consumption and degenerate phase noise.

SUMMARY

In view of the shortcomings of the prior art, the present disclosure provides a low-power fractional-N phase-locked loop circuit, which can effectively compensate the quantization error and reduce the power consumption.

The purpose of the present disclosure is realized by the following technical solution:

A low-power fractional-N phase-locked loop circuit, including a phase detector, a voltage-to-current converter, a loop filter, a voltage-controlled oscillator, a frequency divider and a digital logic processor; wherein the phase detector, the voltage-to-current converter, the loop filter, the voltage-controlled oscillator and the frequency divider are connected in sequence; a reference signal is input from the phase detector, the phase detector detects the phase error between the reference signal and a feedback signal with a quantization error output by the frequency divider, compensates a quantization phase error generated by fractional frequency division, and outputs a compensated phase detection result to the voltage-to-current converter.

The quantization error generated by fractional frequency division is converted into a voltage domain through a digital domain or a current or a capacitance in the phase detector is directly adjusted to complete the compensation of the quantization error.

Further, the phase detector is a constant slope sampling circuit, including a current source, a charging switch, a charging capacitor, a pre-charging switch, a digital-to-voltage converter, a holding switch and a holding capacitor, wherein the current source is connected with one end of the charging switch, the digital-to-voltage converter is connected with one end of the pre-charging switch, and one end of the holding capacitor is connected with one end of the holding switch; the other ends of the charging switch, the pre-charging switch and the holding switch are all connected with one end of the charging capacitor; the other ends of the charging capacitor and the holding capacitor are both grounded; the other end of the digital-to-voltage converter is connected with the digital logic processor.

The digital-to-voltage converter outputs different voltages to adjust an initial voltage of the charging capacitor to compensate the quantization error. The charging time of the current source for the charging capacitor is controlled to complete the phase comparison between the reference signal and the feedback signal.

Further, a timing logic of the phase detector is as follows:

When a rising edge of one of the feedback signal or the reference signal comes, a charging signal controls the charging switch to be turned on, so that the current source charges the charging capacitor.

When the rising edge of the other one of the feedback signal or the reference signal comes, the charging signal controls the charging switch to be turned off and stops the current source from charging the charging capacitor, while a sampling signal controls the holding switch to be turned on, and the holding capacitor samples and holds a voltage on the charging capacitor.

After the sampling and holding is completed, the sampling signal controls the holding switch to be turned off, a pre-charging signal controls the pre-charging switch to be turned on, an output of the digital-to-voltage converter is connected to the charging capacitor, and the digital-tovoltage converter receives a compensation signal of the digital logic processor to adjust an initial charging voltage on the charging capacitor; after pre-charging is completed, the pre-charging signal controls the pre-charging switch to be turned off and waits for the charging switch to be turned on.

Further, the phase detector is a variable slope sampling circuit, including a variable current source, a variable charging capacitor, a holding capacitor, a charging switch, a reset switch and a holding switch; wherein the variable current source is connected with one end of the charging switch, and the holding capacitor is connected with one end of the holding switch; the other ends of the charging switch, the holding switch and the reset switch are all connected with one end of the variable charging capacitor, and the other ends of the variable charging capacitor, the reset switch and the holding capacitor are all grounded;

A slope of a charging ramp is changed by adjusting an output current of the variable current source or the capacitance of the variable charging capacitor to compensate the quantization error caused by fractional frequency division; the charging time of the variable current source for the variable charging capacitor is controlled to complete the phase comparison between the reference signal and the feedback signal.

Further, a timing logic of the phase detector is as follows:

When the rising edge of one of the feedback signal or the reference signal comes, the charging signal controls the charging switch to be turned on, so that the variable current source charges the variable charging capacitor.

When the rising edge of the other feedback signal or reference signal comes, the charging signal controls the charging switch to be turned off and stops the variable current source from charging the variable charging capacitor, while the sampling signal controls the holding switch to be turned on, and the holding capacitor samples and holds a voltage on the variable charging capacitor.

After the sampling and holding is completed, the sampling signal controls the holding switch to be turned off, a reset signal controls the reset switch to be turned on, and the variable charging capacitor is connected to the ground to reset the initial charging voltage to zero; the compensation signal of the digital logic processor is received to adjust a capacitance value of the variable charging capacitor or a current of the variable current source; the reset signal controls the reset switch to be turned off and waits for the charging switch to be turned on.

Further, the voltage-controlled oscillator is a ring oscillator or an LC oscillator.

The present disclosure has the following beneficial effects:

The low-power fractional frequency phase-locked loop circuit of the present disclosure combines the edge conversion processes in the two processes of quantization error compensation and sampling phase detection to reduce the times of edge conversion, thereby reducing power consumption and completing the compensation for the fractional frequency quantization error.

DESCRIPTION OF EMBODIMENTS

The purpose and effect of the present disclosure will become more apparent form the description of the present disclosure in detail with reference to the following drawings and preferred embodiments. It should be understood that the specific embodiments described here are only for explaining the present disclosure, but not for limiting the present disclosure.

Figure 2:
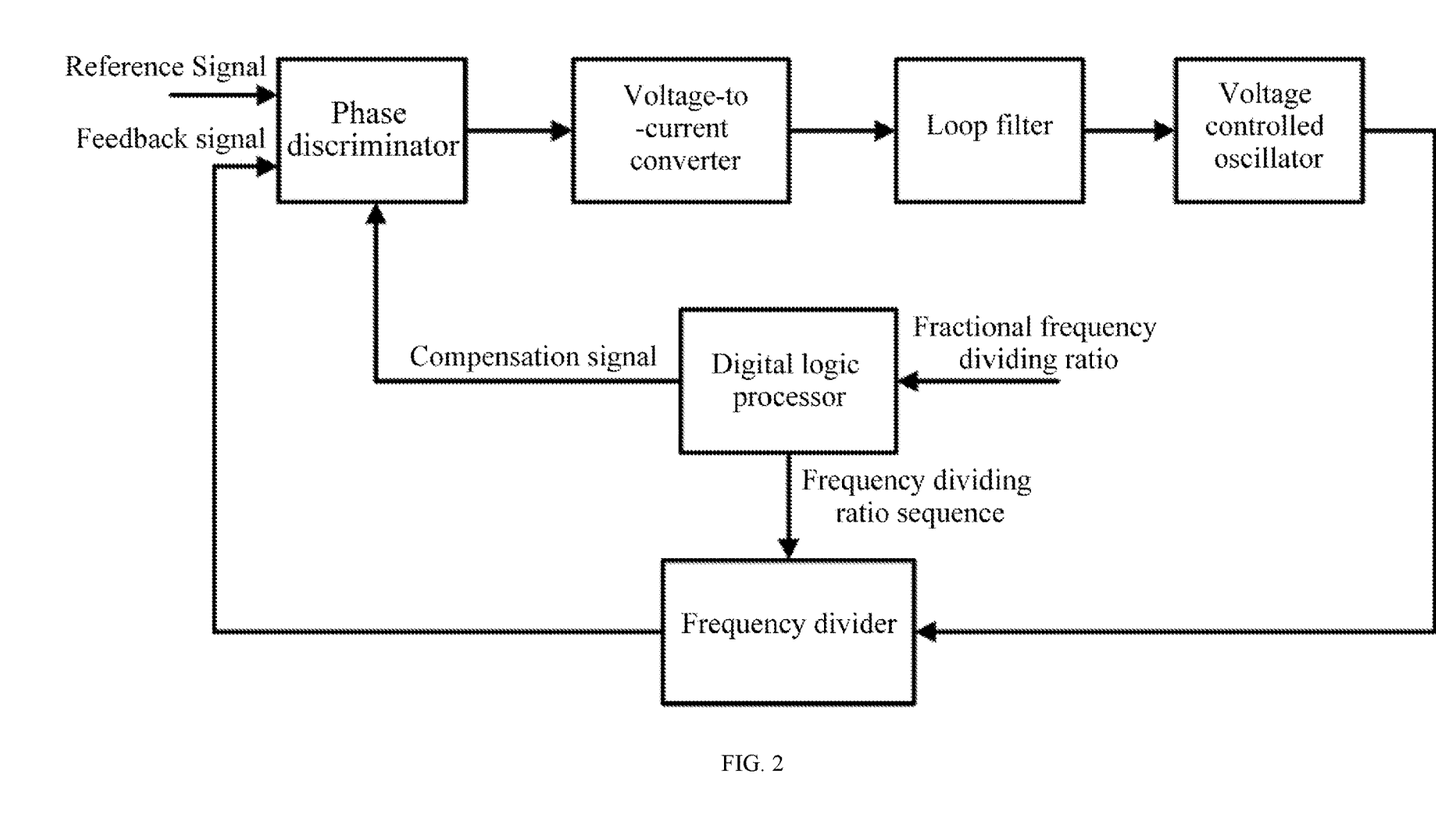
FIG. 2 is a schematic diagram of the structure of a low-power fractional-N phase-locked loop circuit according to the present disclosure.

As shown in FIG. 2, the low-power fractional-N phase-locked loop circuit of the present disclosure includes a phase detector, a voltage-current conversion module, a loop filter, a voltage-controlled oscillator, a frequency divider and a digital logic processor. The phase detector, the voltage-to-current converter, the loop filter, the voltage-controlled oscillator and the frequency divider are connected in sequence; a reference signal is input from the phase detector, and the phase detector detects the phase error between the reference signal and a feedback signal with a quantization error output by the frequency divider, compensates the quantization phase error generated by fractional frequency division, and outputs a compensated phase detection result to the voltage-to-current converter; the voltage-to-current converter compares the sampling voltage of the phase detection result output by the phase detector with an input reference voltage, and outputs a current; the loop filter integrates and filters the current output by the voltage-to-current converter to obtain a control voltage signal for controlling the voltage-controlled oscillator to output an oscillation signal with a corresponding frequency; the frequency divider divides the oscillation signal output by the voltage-controlled oscillator, and realizes fractional frequency division with the frequency dividing ratio modulated by the digital logic processor, and the generated frequency division signal is fed back to the phase detector for feedback adjustment.

The digital logic processor outputs the modulated sequence of integer frequency dividing ratios to the frequency divider, completes fractional frequency division, and continuously calculates the quantization error to obtain a compensation signal, which is then output to the phase detector.

The quantization error generated by fractional frequency division is converted to a compensation voltage through a digital-to-voltage converter, or the current or capacitance in the phase detector is directly adjusted to complete the compensation of the quantization error.

The voltage-controlled oscillator is a ring oscillator or an LC oscillator.

Compared with the traditional fractional phase-locked loop, this system structure combines and merges the function of the digital-to-time converter and the sampling phase detector, which can realize phase detection and compensate quantization error at the same time, and reduce the number of times of edge conversion. Therefore, this structure effectively realizes the compensation of a quantization noise and the detection of a phase error, and reduces the power consumption.

Figure 3:
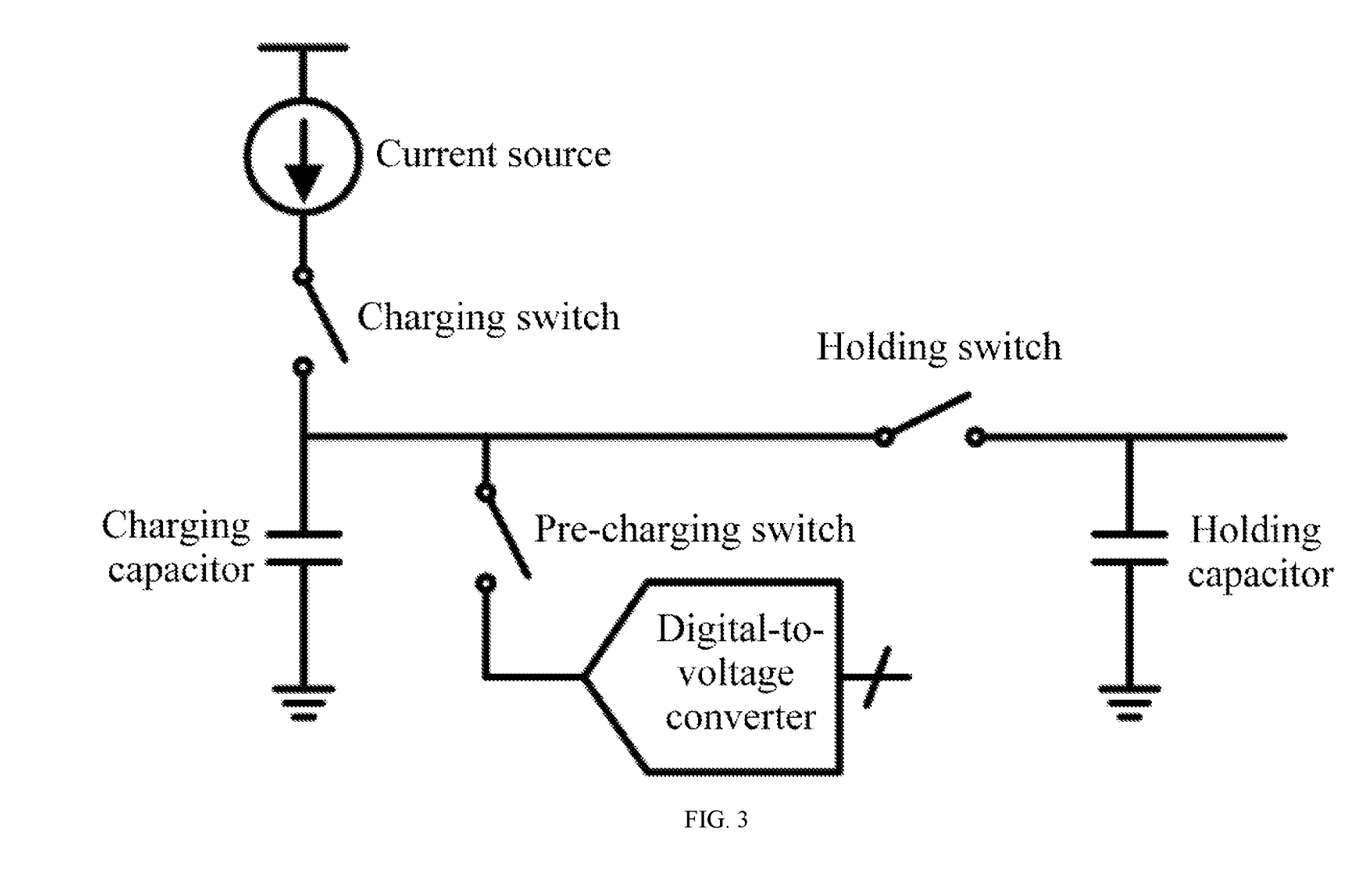
FIG. 3 is a schematic diagram of one embodiment of a phase detector according to the present disclosure.

As one embodiment, as shown in FIG. 3, the phase detector is a constant-slope sampling circuit, which includes a current source, a charging switch, a charging capacitor, a pre-charging switch, a digital-to-voltage converter, a holding switch and a holding capacitor. The current source is connected with one end of the charging switch, the digital-to-voltage converter is connected with one end of the pre-charging switch, and one end of the holding capacitor is connected with one end of the holding switch; the other ends of the charging switch, the pre-charging switch and the holding switch are all connected with one end of the charging capacitor; the other ends of the charging capacitor and the holding capacitor are both grounded; the other end of the digital-to-voltage converter is connected with the digital logic processor.

Figure 4:
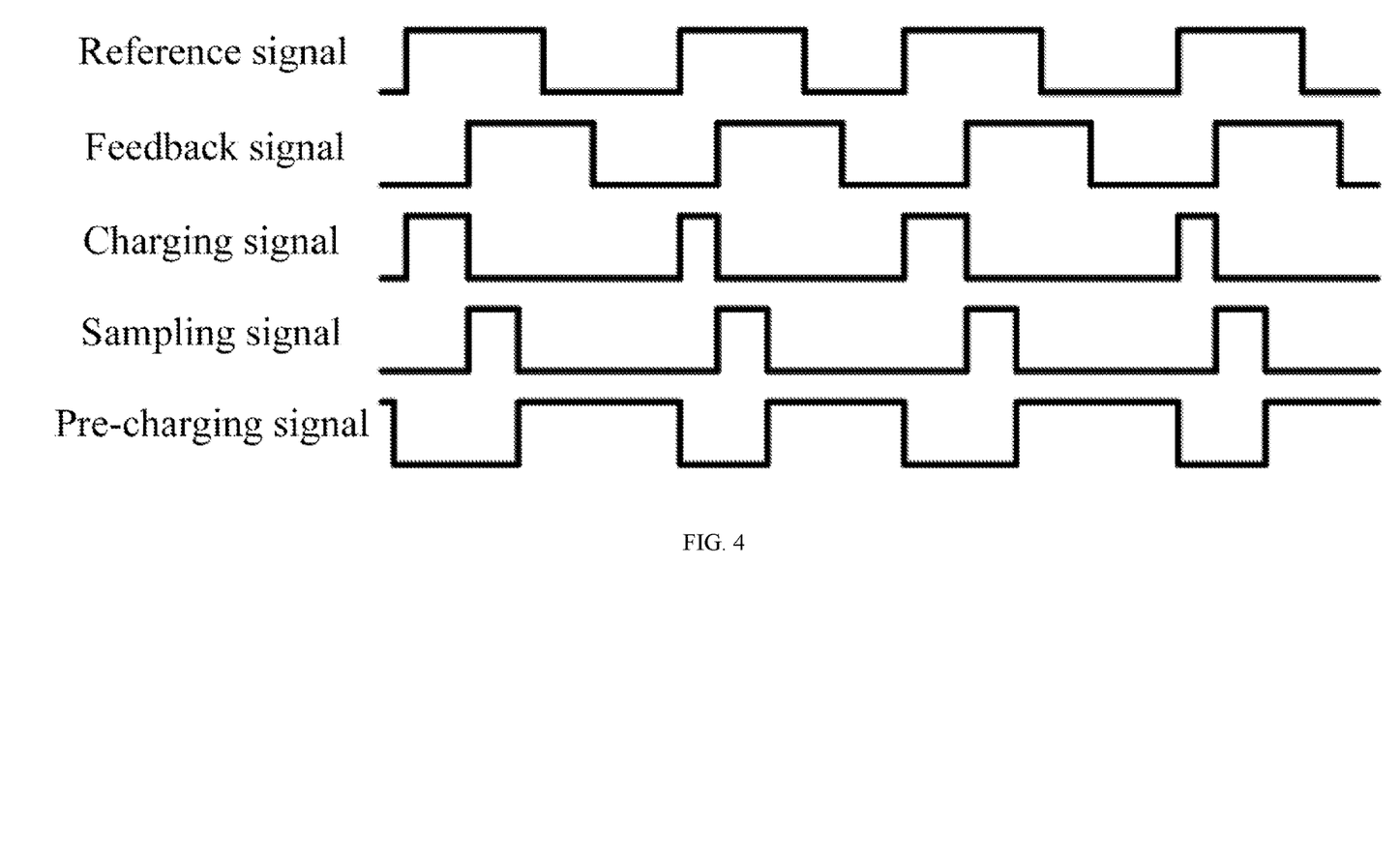
FIG. 4 is a timing diagram of various control signals in one embodiment of the phase detector according to the present disclosure.

The current source charges the charging capacitor, and the holding capacitor is responsible for keeping the voltage at the end of charging. The digital-to-voltage converter receives the compensation signal of the digital logic processor, and its output is connected with the charging capacitor through the pre-charging switch to adjust the initial voltage of each charging. The phase detector is controlled by a timing block, and the reference signal and the feedback signal are used to generate a timing signal to control the current source, the holding capacitor and the digital-to-voltage converter, as shown in FIG. 4. The control process of the timing logic is as follows:

When a rising edge of one of the feedback signal or the reference signal comes, a charging signal controls the charging switch to be turned on, so that the current source charges the charging capacitor.

When the rising edge of the other one of the feedback signal or the reference signal comes, the charging signal controls the charging switch to be turned off and stops the current source from charging the charging capacitor, while a sampling signal controls the holding switch to be turned on, and the holding capacitor samples and holds a voltage on the charging capacitor.

After the sampling and holding is completed, the sampling signal controls the holding switch to be turned off, a pre-charging signal controls the pre-charging switch to be turned on, an output of the digital-to-voltage converter is connected to the charging capacitor, and the digital-to-voltage converter receives a compensation signal of the digital logic processor to adjust an initial charging voltage on the charging capacitor; after pre-charging is completed, the pre-charging signal controls the pre-charging switch to be turned off and waits for the charging switch to be turned on.

The digital-to-voltage converter adopts a R2R structure, including a binary code resistor array and a thermometer code resistor array, and outputs the corresponding compensation voltage according to the compensation signal fed back by digital logic.

The digital-to-voltage converter outputs different voltages to adjust the initial voltage value of the charging capacitor, and the quantization error caused by fractional frequency division is compensated. Then, by controlling the charging time of the current source for the charging capacitor, the phase comparison between the reference signal and the feedback signal is completed, so that the edge conversion times of a sampling fractional frequency-locked loop inserted into the digital-to-time converter in a reference path or a feedback path are reduced, the power consumption is effectively reduced, and the sources of noise and nonlinearity are reduced.

Figure 5:
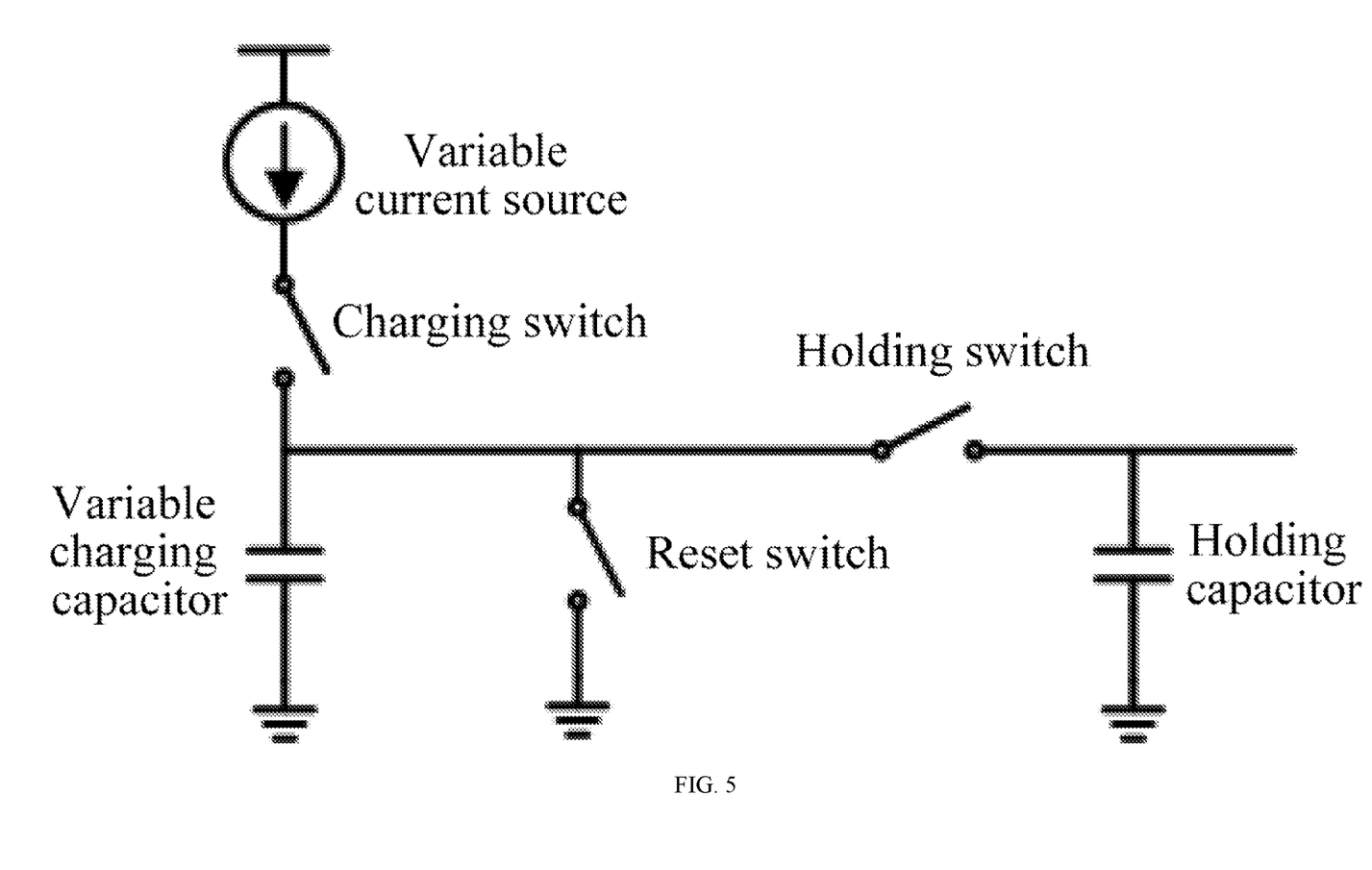
FIG. 5 is a schematic diagram of another embodiment of the phase detector according to the present disclosure.

As shown in FIG. 5, as another embodiment, the phase detector is a variable slope sampling circuit, including a variable current source, a variable charging capacitor, a holding capacitor, a charging switch, a reset switch and a holding switch; The variable current source is connected with one end of the charging switch, the holding capacitor is connected with one end of the holding switch, the other ends of the charging switch, the holding switch and the reset switch are all connected with one end of the variable charging capacitor, and the other ends of the variable charging capacitor, the reset switch and the holding capacitor are all grounded.

By adjusting the output current of the variable current source or the capacitance of the variable charging capacitor to change the slope of the charging ramp, the quantization error caused by fractional frequency division is compensated; the charging time of the variable current source for the variable charging capacitor is controlled, and the phase comparison between the reference signal and the feedback signal is completed.

Figure 6:
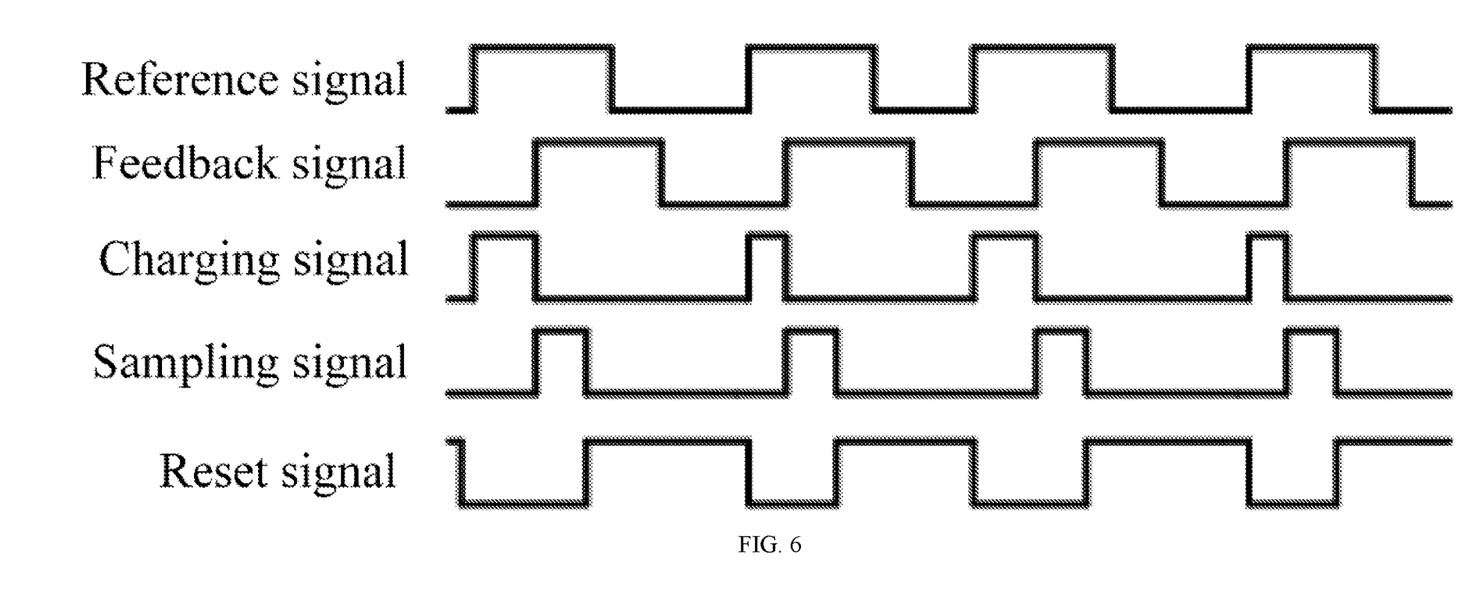
FIG. 6 is a timing diagram of various control signals according to another embodiment of the phase detector of the present disclosure.

As shown in FIG. 6, the timing logic of the phase detector is as follows:

When the rising edge of one of the feedback signal or the reference signal comes, the charging signal controls the charging switch to be turned on, so that the variable current source charges the variable charging capacitor.

When the rising edge of the other feedback signal or reference signal comes, the charging signal controls the charging switch to be turned off and stops the variable current source from charging the variable charging capacitor, while the sampling signal controls the holding switch to be turned on, and the holding capacitor samples and holds a voltage on the variable charging capacitor.

After the sampling and holding is completed, the sampling signal controls the holding switch to be turned off, a reset signal controls the reset switch to be turned on, and the variable charging capacitor is connected to the ground to reset the initial charging voltage to zero; the compensation signal of the digital logic processor is received to adjust a capacitance value of the variable charging capacitor or a current of the variable current source; the reset signal controls the reset switch to be turned off and waits for the charging switch to be turned on.

The current source can be a variable current source array, and the output current can be adjusted according to the compensation signal fed back by the digital signal logic. The charging capacitor can be a variable capacitor array, and the size of the charging capacitor can be adjusted according to the compensation signal fed back by the digital signal logic.

By adjusting the output current of the variable current source or the size of the variable charging capacitor to change the slope of the charging ramp, the quantization error caused by fractional frequency division is compensated, and then the phase comparison between the reference signal and the feedback signal is completed by controlling the charging time of the current source for the charging capacitor, so that the edge conversion times of the sampling fractional-N phased-locked loop in a reference path or a feedback path are reduced, the power consumption is effectively reduced, and the sources of noise and nonlinearity are reduced.

It can be understood by those skilled in the art that the above examples are only preferred examples of the present disclosure, and are not intended to limit the present disclosure. Although the present disclosure has been described in detail with reference to the above examples, it is still possible for those skilled in the art to modify the technical solutions described in the above examples or equivalently replace some of the technical features. The modifications, equivalents and substitutions made within the spirit and principle of the present disclosure shall be included in the scope of protection of the present disclosure.

What is claimed is:

1. A low-power fractional-N phase-locked loop circuit, comprising a phase detector, a voltage-to-current converter, a loop filter, a voltage-controlled oscillator, a frequency divider and a digital logic processor; wherein the phase detector, the voltage-to-current converter, the loop filter, the voltage-controlled oscillator and the frequency divider are connected in sequence; a reference signal is input from the phase detector, the phase detector detects the phases error between the reference signal and a feedback signal with a quantization error output by the frequency divider, compensates a quantization phase error generated by fractional frequency division, and outputs a compensated phase detection result to the voltage-to-current converter;

wherein the quantization error generated by fractional frequency division is converted into a voltage domain through a digital domain or a current or a capacitance in the phase detector is directly adjusted to complete compensation of the quantization error; and wherein the phase detector is a constant slope sampling circuit or a variable slope sampling circuit;

when the phase detector is a constant slope sampling circuit, the phase detector comprises a current source, a charging switch, a charging capacitor, a pre-charging switch, a digital-to-voltage converter, a holding switch and a holding capacitor, wherein the current source is connected with one end of the charging switch, the digital-to-voltage converter is connected with one end of the pre-charging switch, and one end of the holding capacitor is connected with one end of the holding switch; the other ends of the charging switch, the pre-charging switch and the holding switch are all connected with one end of the charging capacitor; the other ends of the charging capacitor and the holding capacitor are both grounded; the other end of the digital-to-voltage converter is connected with the digital logic processor; the digital-to-voltage converter outputs different voltages to adjust an initial voltage value of the charging capacitor to compensate the quantization error caused by fractional frequency division; a charging time of the current source for the charging capacitor is controlled to complete the phase comparison between the reference signal and the feedback signal; and when the phase detector is a variable slope sampling circuit, the phase detector comprises a variable current source, a variable charging capacitor, a holding capacitor, a charging switch, a reset switch and a holding switch; wherein the variable current source is connected with one end of the charging switch, and the holding capacitor is connected with one end of the holding switch; the other ends of the charging switch, the holding switch and the reset switch are all connected with one end of the variable charging capacitor, and the other ends of the variable charging capacitor, the reset switch and the holding capacitor are all grounded; a slope of a charging ramp is changed by adjusting an output current of the variable current source or a size of the variable charging capacitor to compensate the quantization error caused by fractional frequency division; the charging time of the variable current source for the variable charging capacitor is controlled to complete the phase comparison between the reference signal and the feedback signal.

2. The low-power fractional-N phase-locked loop circuit according to claim 1, wherein when the phase detector is a constant slope sampling circuit, a timing logic of the phase detector is as follows:

when a rising edge of one of the feedback signal or the reference signal arrives, a charging signal controls the charging switch to be turned on, so that the current source charges the charging capacitor;

when the rising edge of the other one of the feedback signal or the reference signal arrives, the charging signal controls the charging switch to be turned off and stops the current source from charging the charging capacitor, while a sampling signal controls the holding switch to be turned on, and the holding capacitor samples and holds a voltage on the charging capacitor;

after the sampling and holding is completed, the sampling signal controls the holding switch to be turned off, a pre-charging signal controls the pre-charging switch to be turned on, an output of the digital-to-voltage converter is connected to the charging capacitor, and the digital-to-voltage converter receives a compensation signal of the digital logic processor to adjust an initial charging voltage on the charging capacitor; after pre-charging is completed, the pre-charging signal controls the pre-charging switch to be turned off and waits for the charging switch to be turned on.

3. The low-power fractional-N phase-locked loop circuit according to claim 1, wherein when the phase detector is a variable slope sampling circuit, a timing logic of the phase detector is as follows:

when the rising edge of one of the feedback signal or the reference signal arrives, the charging signal controls the charging switch to be turned on, so that the variable current source charges the variable charging capacitor;

when the rising edge of the other feedback signal or reference signal arrives, the charging signal controls the charging switch to be turned off and stops the variable current source from charging the variable charging capacitor, while the sampling signal controls the holding switch to be turned on, and the holding capacitor samples and holds a voltage on the variable charging capacitor;

after the sampling and holding is completed, the sampling signal controls the holding switch to be turned off, a reset signal controls the reset switch to be turned on, and the variable charging capacitor is connected to the ground to reset the initial charging voltage to zero; the compensation signal of the digital logic processor is received to adjust a capacitance value of the variable charging capacitor or a current of the variable current source; the reset signal controls the reset switch to be turned off and waits for the charging switch to be turned on.

4. The low-power fractional-N phase-locked loop circuit according to claim 1, wherein the voltage-controlled oscillator is a ring oscillator or an LC oscillator.

* * * * *